United States Patent
Fourkas et al.

(10) Patent No.: US 10,459,337 B2
(45) Date of Patent: Oct. 29, 2019

(54) MULTICOLOR PHOTOLITHOGRAPHY MATERIALS AND METHODS

(71) Applicant: University of Maryland, College Park, College Park, MD (US)

(72) Inventors: John T. Fourkas, Bethesda, MD (US); Daniel E. Falvey, Takoma Park, MD (US); Zuleykhan Tomova, Greenbelt, MD (US); Steven Wolf, Riverdale, MD (US); Katie Brennan, College Park, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 15/377,578

(22) Filed: Dec. 13, 2016

(65) Prior Publication Data

US 2017/0168392 A1 Jun. 15, 2017

Related U.S. Application Data

(60) Provisional application No. 62/267,127, filed on Dec. 14, 2015.

(51) Int. Cl.
  *G03F 7/20* (2006.01)
  *G03F 7/031* (2006.01)

(52) U.S. Cl.
  CPC ............ *G03F 7/031* (2013.01); *G03F 7/2022* (2013.01); *G03F 7/70458* (2013.01); *G03F 7/70466* (2013.01)

(58) Field of Classification Search
  CPC .................. G03F 7/70466; G03F 7/70458
  USPC ...................... 430/394, 325, 281.1
  See application file for complete search history.

(56) References Cited

U.S. PATENT DOCUMENTS

| | | | |
|---|---|---|---|
| 3,615,454 A * | 10/1971 | Cescon ................ | G03C 1/732 430/270.1 |
| 3,721,561 A | 3/1973 | Jones et al. | |
| 4,304,838 A | 12/1981 | Hasegawa et al. | |
| 4,423,135 A | 12/1983 | Chen et al. | |
| 5,236,812 A * | 8/1993 | Vassiliou ............. | B29C 64/135 430/269 |
| 2005/0202352 A1 | 9/2005 | Cyganski et al. | |
| 2005/0256218 A1 | 11/2005 | Lachowicz et al. | |
| 2007/0269747 A1 | 11/2007 | Bahadur et al. | |
| 2011/0039213 A1 | 2/2011 | Fourkas et al. | |
| 2013/0197156 A1 | 8/2013 | Palasz et al. | |
| 2014/0221520 A1 | 8/2014 | Weijnen et al. | |
| 2015/0185617 A1 | 7/2015 | Markle et al. | |

FOREIGN PATENT DOCUMENTS

WO  2013164394 A1  11/2013

OTHER PUBLICATIONS

Fourkas, J.T. (2011) "Rapid Lithography: New Photoresists Achieve Nanoscale Resolution," Optics & Photonics News, Jun. 2011, pp. 24-29.
Fourkas, J.T. & Petersen, J.S. (2014) "2-Colour photolithography," Phys. Chem. Chem. Phys., 16:8731-8750.
Singh et al. (1969), J. Phys. Chem. 73:2633-2643.
Tomova et al. (2015) "Resolution enhancement through three color photolithography," Proc. Spie 9353, Laser 3D Manufacturing II, 935312.
IPRP Application No. PCT/US2016/066376 (8 pages).
ISR Application No. PCT/US 2016/066376 (2 pages).

* cited by examiner

*Primary Examiner* — John S Chu
(74) *Attorney, Agent, or Firm* — William C. Schrot; AuerbachSchrot LLC

(57) ABSTRACT

The present invention relates to photoresist compositions comprising a base resin such as a monomer capable of radical polymerization upon photoinitiation, and photoinitiator molecules such as a diketone, and multicolor photolithography methods. Photoresist compositions comprise photoinitiator molecules that are exposed to a first radiation source, thereby exciting the photoinitiator molecules from a ground state to a pre-activated state. The pre-activated state molecules are then exposed to a second radiation source in selected locations, thereby deactivating the pre-activated state molecules in the selected locations. Any remaining pre-activated state molecules are exposed to a third radiation source, exciting such remaining pre-activated state photoinitiator molecules to an activated state. Polymerization of the base resin is then initiated.

7 Claims, 7 Drawing Sheets
(1 of 7 Drawing Sheet(s) Filed in Color)

without deactivation     with deactivation

MULTICOLOR PHOTOLITHOGRAPHY MATERIALS AND METHODS

CROSS-REFERENCE TO RELATED APPLICATIONS

This application is based on U.S. Provisional Patent Application Ser. No. 62/267,127, entitled "Materials for Multicolor Photolithography," filed Dec. 14, 2015, which application is incorporated herein by reference in its entirety and to which priority is claimed.

STATEMENT REGARDING FEDERALLY SPONSORED RESEARCH OR DEVELOPMENT

This invention was made with government support by the National Science Foundation (NSF) under CMMI1449309 and IIP1318211. The United States government has certain rights in this invention.

FIELD OF THE INVENTION

The present invention relates to photoresist compositions comprising a base resin and diketone photoinitiator molecules, and methods preferably utilizing the disclosed photoresist compositions.

BACKGROUND OF THE INVENTION

In semiconductor lithography, device component features of an integrated circuit should be produced in a manner that is insensitive to process variation, such that the finished devices function within design tolerance. The lithographic process must also have sufficient throughput to meet market demand while maintaining a cost-per-device that is similar to that of all preceding generations. For semiconductor manufacture to remain profitable, the amount of functionality on a chip of a given size ideally doubles every 18 to 24 months. This requirement is equivalent to a doubling of the number of component features that can be fabricated on a chip in every cycle of Moore's Law, which provides that the density of transistors in integrated circuits doubles every two years (Moore, G. E. (1965) "*Cramming more components onto integrated circuits*," Electronics, 38(8):114-117).

As known in the art, the resolution in conventional photolithographic techniques is directly proportional to the wavelength of light employed for exposure. A commonly used guideline for the diffraction limit is the Abbe criterion:

$$d = \frac{\lambda}{2NA},$$

where d is the transverse resolution (defined as the shortest distance between resolvable features in imaging and the shortest repeat distance for printable features in photolithography), $\lambda$ is the wavelength of light, and NA is the numerical aperture of the imaging system. The NA is defined by the product of the refractive index of the medium and the sine of the half-angle over which light is collected (in the case of imaging) or focused (in the case of photolithography).

This relationship has created great challenges for the continued progress of Moore's Law, as conventional photolithographic approaches are not focusing on the use of extreme ultraviolet (EUV) light, given EUV is expensive and difficult to generate, propagate and manipulate. As such, the predominant strategy for maintaining the course of Moore's law in semiconductor lithography has been to find ways to perform photolithography with ever shorter wavelengths of light. However, each reduction in wavelength brings its own set of challenges in optics and material chemistry. As the wavelength of light becomes shorter, generating, propagating, and manipulating the light becomes increasingly difficult and expensive. Moreover, the light tends to interact with virtually every material, requiring that propagation occur in a vacuum and that special, relatively expensive optics be used for manipulation. As such, it becomes more challenging to develop suitably robust resist materials.

Thus, particular attention is given to the physics, chemistry and engineering of imaging. Engineering approaches seek to provide the best quality image of the desired pattern in the medium, and therefore a detailed knowledge of how that image is recorded is required. The final developed photoresist image is a function of the contrast of the projected image as recorded through the thickness of the photoresist film, the density and uniformity of the photoevents needed to produce the image, and the development contrast of that recorded medium. For engineering process purposes, it is convenient to know the contrast of the projected image of the photomask and how that contrast translates into: (1) the image that forms in the resist film; (2) the latent image that is subsequently recorded; (3) the latent image formed after the post-exposure bake process; and (4) the develop-rate response to the integrated exposure and the thermal dose profile.

The image is formed by transmission of light through, or reflection of light from, a pattern of the objects to be imaged, or photomask pattern. The photomask pattern is focused onto a substrate using a projection lens which forms an image, referred to as the aerial image. The aerial image forms when portions of the diffraction pattern that arise from the interaction of the exposure radiation with the photomask pass through the projection lens and converge at the best focus at the image plane, interfering constructively. Most instances in semiconductor lithography do not involve point convergence. Instead, the image that is actually recorded in the photoresist is a convolution of the diffraction pattern and the pupil function ($\sigma=\sin(\alpha_{ill})/NA$), where $\alpha_{ill}$ is the maximum half-cone angle of the illumination impinging on the mask objects, and $\sigma$ represents the partial coherence of the system). The image can be degraded by lens aberrations and/or modified by pupil filters. Ideally, the aerial image forms a square-wave intensity profile, but at extreme resolution the image quality is lost because the NA filters out higher diffraction orders. The loss of the electric field information contained in these higher diffraction orders results in a degraded image.

With respect to chemistry, the photoresist material acts as a threshold detector of the aerial image as recorded in the film. With little to no exposure, no visible change is observed in the material after development. As the exposure dose increases, a threshold is reached in which there is a clear physical response in the material. This threshold is attained first at the intensity maxima of the image, where the shape of the object to be printed is first realized. As the exposure dose is increased further, more regions of the recorded image distribution in the resist reach this threshold. However, if there is continued exposure, even the regions that receive minimum intensity surpass the threshold. Such overexposure results in the loss of the image to be printed and/or feature resolution.

Typically, the lithography engineer samples a narrow range of aerial image intensity in the neighborhood of the final feature size, ultimately creating a developed and etched device component of the desired size and shape. In the region in which the latent image is sampled to form the final developed and etched component feature, the photoresist development response is usually nonlinear. The response is not binary, however, so there is a response in the subthreshold regions that depends on the resist's development rate with respect to the integrated dose in that region of the latent image. Because of this phenomenon, the latent image is typically not sampled at the image width that matches the desired size to yield that target. Instead, one uses a somewhat lower dose for positive-tone resists and a somewhat higher dose for negative-tone resists. The exposed resist is then etched back to the target size using a developer. Etch-back depends on the image recorded in the resist, with low-contrast images having larger bias than high-contrast images for the same developer processing conditions.

The complex relationship between physical and chemical contrast is at the heart of the ultimate production resolution for a given set of imaging conditions. It is not enough simply to produce an image; the image must also have an adequate contrast to interact with the resist contrast. Wavefront and resist engineers therefore pay particular attention to the dependence of the resist response on the location where the latent image is sampled, on the exposure dose, and on the sampling of other sets of latent images generated with changes in focus, changes in pitch, and changes in duty cycle (the line:space ratio). The goal is to maximize process tolerance for all features being imaged across some common process window of focus and dose variation that has been determined to be required to produce the target yield in the production of integrated circuits.

The usable contrast that can be sampled to form the image depends on how the resist responds to changes in contrast for the portion of the aerial image that is sampled to produce the resultant image. The response to focus variation in terms of feature size, line edge roughness and image placement must be minimized for all features of interest. The resultant half-pitch of the transverse resolution may be described using a variant of the Rayleigh equation ($CD=k_1(\lambda/NA)$, where $k_1$ is a process parameter). Resolution to a semiconductor lithographer is the smallest pitch that is imaged with a manufacturable process for a feature of that pitch, rather than the smallest single printable image.

The ongoing need to create smaller features has driven the approaches to imaging with smaller $\lambda$ and larger NA in order to enhance resolution. These approaches have been supplemented by decreasing $k_1$ with the use of: (1) partially-coherent illumination tuning; (2) strong phase-shift masks and low-partial-coherence, on-axis illumination; or (3) weak phase shift masks, in particular with on-axis and off-axis illumination. Such approaches may also be supplemented or enabled by the use of optical proximity correction and assist features to tune the diffraction pattern, such that it provides the optimum interference to produce images with the highest fidelity under the specific imaging conditions.

An alternative class of approaches to improving photolithographic resolution has been developed which rely on the use of two colors of light, one of which exposes a photoresist and another of which acts to counteract or inhibit this exposure (see Fourkas, J. T. and Petersen, J. S. (2014) "*2-Colour photolithography*," Phys. Chem. Chem. Phys. 16:8731-8750); Fourkas, J. T. (2011) "*RAPID Lithography: New Photoresists Achieve Nanoscale Resolution*," Opt. Photon. News 22, p. 24). Such approaches provide for the use of visible light (e.g., electromagnetic radiation having wavelengths in the range of 400 nanometers (nm) to 700 nm), which is inexpensive to generate, propagate and manipulate, to create features with nanoscale resolution. Thus, the key feature of a two-color photoresist is that it responds in a different manner to two different light sources, which are typically at two different wavelengths. Two-color photolithography approaches provide for negative-tone photoresists, in which case an excitation light source is used to initiate crosslinking in the photoresist and a deactivation light source is used to prevent or to quench the crosslinking. The spatial distributions of the two light sources differ in a manner designed to minimize the dimensions of the features that are fabricated.

Two-color approaches to photolithography have relied on a range of different mechanisms for deactivation, including stimulated emission, absorption modulation, photoinduced radical quenching, photoinduced back-transfer of electrons, and reverse intersystem crossing (RISC). Typically, one color of light is first used to excite the photoinitiator (PI) molecules in the photoresist in a desired pattern. A second color of light, which is of a longer wavelength than the first color of light, is used to drive the PI molecules back to the ground state before they have had the chance to cause chemistry to occur within the photoresist.

In such two-color approaches, the range of materials that undergo these processes without undesirable side reactions has been very limited. Furthermore, the pattern of the deactivation is typically complementary to the pattern of excitation, such that the photoresist ends up being exposed effectively only in the regions in which the intensity of the deactivation beam is at a minimum. The materials reported to date have suffered from the shortcoming that the state that is deactivated also leads to reaction, which means that these two processes compete with one another. This competition invariably leads to the buildup of background exposure when tightly-packed features are created, ultimately limiting the resolution that can be attained using such approaches.

Thus, a limitation of such conventional two-color approaches is that, although features can be much smaller than either of the wavelengths of light employed, the minimum pitch (i.e., the distance between two features) is determined by the wavelength used for deactivation. As such, multiple patterning steps are required in two-color approaches in order to obtain densely packed features. However, in such two-color approaches, deactivation and chemistry both occur from the same state, and so these processes necessarily compete with one another. As a result, it is not possible to completely deactivate a region of the photoresist that has been excited. This phenomenon leads to a degradation of the resolution as the number of patterning steps increases.

Thus, there is a need for improved photoresist compositions and methodologies for high-resolution photolithography which overcome some or all of the above-noted problems.

SUMMARY OF THE INVENTION

The present invention is directed to photoresist compositions and photolithography methods. The photoresist compositions comprise a class of molecules that act as three-color radical photoinitiators. The operating principle of the disclosed compositions provides for the use of one color of light to excite the photoinitiator (PI) molecules to an unreactive, "pre-activated" state. A second color of light is then used to deactivate the PI molecules in selected spatial locations. Finally, a third color of light is used to take any remaining pre-activated PI molecules to an activated state, after which chemical reaction occurs.

The three-color approach eliminates the competition between deactivation and initiation, and additionally allows all three colors of light to be patterned to attain substantially superior resolution as compared to prior approaches. In the disclosed three-color photolithography approach, deactivation occurs from a pre-activated state. Only after the desired regions have been deactivated are the remaining PI molecules transferred to the activated state from which chemistry occurs, thus eliminating the competition between these processes.

The disclosed methods provide many advantages over prior lithography approaches. It should be understood that light as used herein refers to electromagnetic radiation within the electromagnetic spectrum, e.g., including ultraviolet light (preferably having wavelengths from about 100 nm to about 400 nm), visible light (with wavelengths from about 400 nm to about 700 nm), and infrared light (with wavelengths from about 700 nm to about 1 mm). In some embodiments, visible light may be utilized, which can be generated, propagated, and manipulated readily and at relatively low cost. Moreover, the disclosed methods are much gentler on a wide range of materials as compared to short-wavelength radiation, offering many more options to photoresist chemistry. In disclosed embodiments, efficient photoresist chemistry is provided that may be implemented in thin films for large-area, linear exposure, which are compatible with high-fidelity pattern transfer.

A photoresist composition in accordance with the present invention comprises a base resin and photoinitiator molecules of a diketone having substituent groups $R_1$ and $R_2$. In some embodiments, at least one of $R_1$ or $R_2$ is selected from the group consisting of an alkyl substituent, an aryl substituent, a substituted aryl substituent, a heterocyclic aryl substituent, a cycloalkene substituent, and a heterocyclic cycloalkene substituent.

In some implementations, the alkyl substituent is an ethyl group ($C_2H_5$), a propyl group ($C_3H_7$), an isopropyl group ($C_3H_8$) a methyl group ($CH_3$), or a tert-butyl group ($C_4H_{10}$). In some implementations, the aryl substituent is a phenyl group ($C_6H_5$), a naphthyl group (Cloth), or an anthryl group ($C_{14}H_{10}$). In some implementations, the substituted aryl substituent is tolyl group ($CH_3C_6H_4$), a xylyl group (($CH_3)_2C_6H_3$), a chlorophenyl group (CxHxCl), or a fluorophenyl group (CxHxF). In some implementations, the heterocyclic aryl substituent is a pyridyl group ($C_5H_4N$) or a pyrazyl group ($C_3H_3N_2$). In some implementations, the cycloalkene substituent is a cyclopentadienyl group ($C_5H_5$). In some implementations, the heterocyclic cycloalkene substituent is a furyl group ($C_4H_{3O}$), a thiophenyl group ($C_4H_3S$), a pyrrolyl group ($C_4H_4N$), an imidazolyl group ($C_3N_2H_4$) or a thiozolyl group ($C_3H_3NS$). In one implementation, each of $R_1$ and $R_2$ is a methyl group. In another implementation, each of $R_1$ and $R_2$ is a phenyl group.

In some embodiments, the diketone substituent group $R_1$ or $R_2$ comprises a reactive monomer with polymerizable functionality. In one implementation, each of $R_1$ and $R_2$ is a dipentaerythritol pentaacrylate group. In some embodiments, the photoresist composition includes a photoinitiator selected from the group consisting of biacetyl ($C_4H_6O_2$), benzil ($C_6H_5CO_2$), 2.2'-pyridil ($C_{12}H_8N_2O_2$), α-naphthil ($C_{22}H_{14}O_2$), β-naphthil ($C_{22}H_{14}O_2$), and furil ($C_{10}H_6O_4$).

In some embodiments, the base resin of the photoresist composition is a monomer or a mixture of monomers. In one implementation, the composition comprises dipentaerythritol pentaacrylate. In another implementation, the composition comprises tris(2-hydroxy ethyl) isocyanurate triacrylate and ethoxylated(6) trimethylolpropane triacrylate.

In some embodiments, the photoresist composition is composed of between about 0.1 weight percent (wt %) and about 10 wt % of photoinitiator, more preferably between about 0.5 weight percent (wt %) and about 2 wt % of photoinitiator. For example, the composition may contain about 1 wt % of photoinitiator.

The present invention also relates to a multicolor photolithography method, comprising the steps of: providing a substrate at least partially coated with a layer of photoresist composed of photoinitiator (PI) molecules and reactive monomer(s); exposing the PI molecules to a first radiation source, thereby exciting the PI molecules from a ground state to an unreactive, pre-activated state; exposing the pre-activated state PI molecules to a second radiation source in selected locations, thereby deactivating the pre-activated state PI molecules in the selected locations; and exposing any of the remaining pre-activated state PI molecules to a third radiation source, thereby exciting the remaining pre-activated state PI molecules to an activated state, and initiating polymerization of the monomers in the photoresist.

In some embodiments, the first, second and/or third radiation source is a pulsed laser. In some implementations, the pulsed laser emits radiation having a wavelength of between about 720 nm and about 875 nm. In some implementations, the first, second and/or third radiation source is a continuous-wave laser. In some implementations, the continuous-wave laser emits radiation having a wavelength of between about 720 nm and about 950 nm. In one implementation, the first radiation source is a pulsed laser, the second radiation source is a continuous-wave laser, and the third radiation source is a pulsed laser. In other embodiments, the first, second and/or third radiation source emits visible light.

BRIEF DESCRIPTION OF THE DRAWINGS

The patent or application file contains at least one drawing/photograph executed in color. Copies of this patent or patent application publication with color drawing(s) will be provided by the Office upon request and payment of the necessary fee.

DETAILED DESCRIPTION OF EMBODIMENTS OF THE INVENTION

The present invention is directed to photoresist compositions and photolithography methods preferably utilizing the disclosed compositions. The photoresist compositions comprise a class of molecules that act as three-color radical photoinitiators. The operating principle of the disclosed materials is to use a first radiation source that emits a first color or wavelength of light to excite the molecules to an unreactive, "pre-activated" state. A second radiation source emits a second color or wavelength of light which deactivates the molecules in selected spatial locations. Finally, a third radiation source emits a third color or wavelength of light takes any remaining pre-activated molecules to an activated state that leads to chemical reaction. Note that the first, second and third colors or wavelengths of light may be different and/or alternatively have differing emission characteristics (e.g., such as pulsed, continuous wave, etc.). Thus, in some embodiments, the first, second and/or third radiation sources emit radiation of similar or identical wavelength. In other embodiments, the radiation wavelength and/or emission characteristics of the first, second and/or third radiation sources differ.

Figure 1:
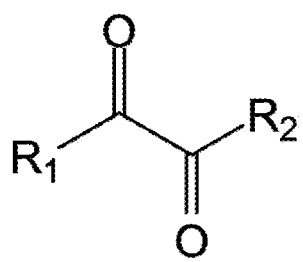
FIG. 1 illustrates the general structure of a vicinal diketone with substituents $R_1$ and $R_2$.

We disclose a general class of materials that undergoes this type of photochemistry: vicinal diketones, the general form of which is shown in FIG. 1. The two substituent groups $R_1$ and $R_2$ can be of any of a broad range, including alkyl groups such as ethyl, propyl, and isopropyl, and particularly alkyl groups for which there preferably will be no methylene or methane groups adjacent to the ketone, such as methyl or tert-butyl; aryl groups such as phenyl and naphthyl, and anthryl; substituted aryl groups such as tolyl, xylyl, chlorophenyl, and fluorophenyl; heterocyclic aryl groups such as pyridyl and pyrazyl; cycloalkenes such as cyclopentadiene; heterocyclic cycloalkenes, such as furyl, thiophenyl, pyrrolyl, imidazolyl, or thiozolyl; or more complex groups.

In some embodiments, the photoresist composition includes a photoinitiator selected from the group consisting of biacetyl ($C_4H_6O_2$), benzil ($C_6H_5CO_2$), 2.2'-pyridil ($C_{12}H_8N_2O_2$), α-naphthil ($C_{22}H_{14}O_2$), β-naphthil ($C_{22}H_{14}O_2$), and furil ($C_{10}H_6O_4$).

In one preferred embodiment of these materials, the photoinitiator is biacetyl, for which $R_1$ and $R_2$ are both methyl groups. In another preferred embodiment, the initiator is benzil (1,2-diphenylethane-1,2-dione; $C_6H_5CO_2$), for which $R_1$ and $R_2$ are both phenyl groups. Preferably, the composition comprises the initiator mixed with a reactive acrylate or methacrylate monomer or mixture of monomers, with the photoinitiator at a few weight percent of the composition. Preferably, this monomer or monomer mixture is viscous and contains at least one component that has multiple acrylates or methacrylates in each molecule. Thus, a wide array of monomers and monomer mixtures are suitable for use in the disclosed compositions. Suitable monomers and monomer mixtures, and in particular acrylic and/or methacrylic monomer(s) capable of being photopolymerized using a radical photoinitiator, are available from Sartomer Americas (Exton, Pa.). In one preferred embodiment the monomer is dipentaerythritol pentaacrylate ($C_{25}H_{32}O_{12}$). In another preferred embodiment the monomer consists of equal weight percentages of tris (2-hydroxyethyl) isocyanurate triacrylate ($C_{21}H_{27}N_3O_9$) and ethoxylated(6) trimethylolpropane triacrylate ($C_{21}H_{32}O_9$).

Figure 2:
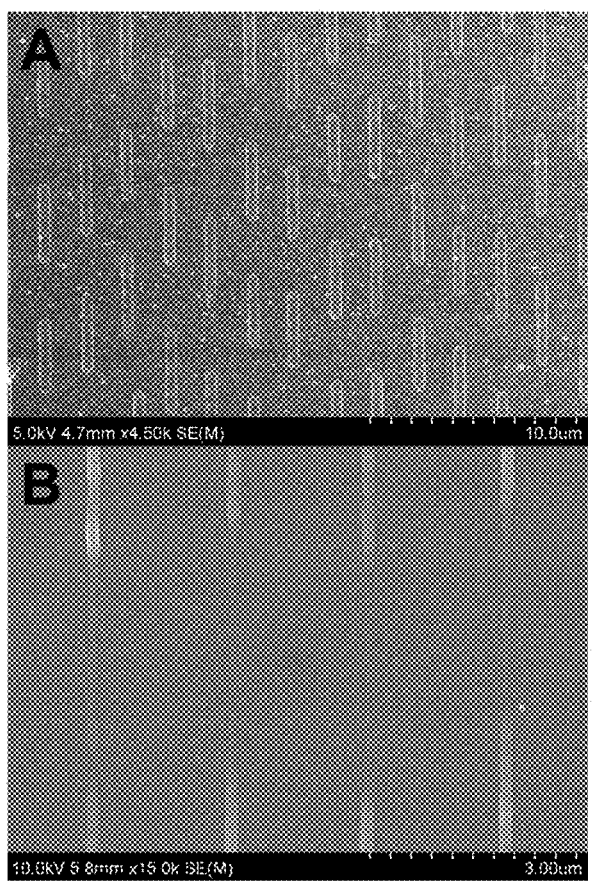
FIG. 2, Plate A, is an SEM image of unpatterned, chopped deactivation of a photoresist containing biacetyl as the initiator. Plate B is an SEM image showing resolution enhancement by patterned deactivation of a photoresist containing biacetyl as the initiator.

In the case of biacetyl, initial excitation to $S_1$ may be accomplished using a two-photon transition driven by an ultrafast pulsed laser at a wavelength between about 720 nm and about 875 nm. Deactivation may then be accomplished using a continuous-wave laser tuned between about 720 nm and about 950 nm, though deactivation can be accomplished utilizing radiation having an even broader range of wavelength. As shown in FIG. 2A, the presence of the deactivation beam inhibits radical polymerization completely in a photoresist composed of 1 wt % of biacetyl in dipentaerythritol pentaacrylate. Any photoinitiator molecules that have not been deactivated are then excited to an activated state, e.g. using two-photon absorption from a second ultrafast pulsed laser that is tuned between about 720 nm and about 875 nm. Further, when the deactivation beam passes through an appropriate phase mask before being focused, it provides a substantial improvement in resolution (FIG. 2B).

In another preferred embodiment, one of the R groups on the initiator comprises a reactive monomer (e.g., tetraethylene glycol diacrylate, tetraethylene glycol dimethacrylate, neopentylglycol diacrylate, tricyclodecane dimethanol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethyloipropane triacrylate, pentaerythritol triacrylate, ethoxylated trimethyloipropane triacrylate, glyceryl propoxy triacrylate, pentaerythritol tetraacrylate, dipentaerythritol pentaacrylate, glycidyl acrylate, glycidylmethyl acrylate, or combinations thereof).

Figure 3:
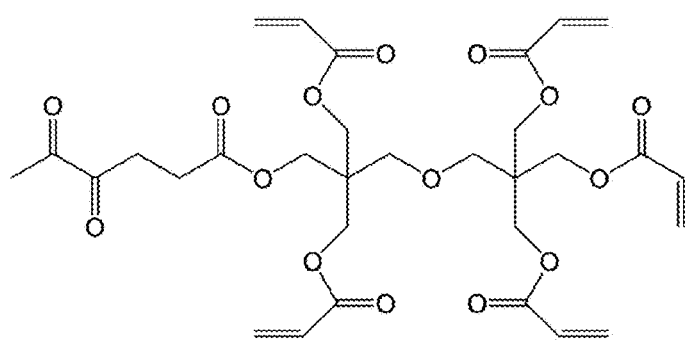
FIG. 3 illustrates a representative exemplary structure of biacetyl covalently bonded to a multiacrylic monomer.

In some embodiments, $R_1$ is a methyl group and $R_2$ is a group containing multiple acrylate groups. The chemical formula for such material is shown in FIG. 3, and exhibits the same deactivation behavior as compared to biacetyl in SR 399. However, the combined initiator/monomer material has reduced initiator diffusion, which contributes to finer resolution.

Figure 4:
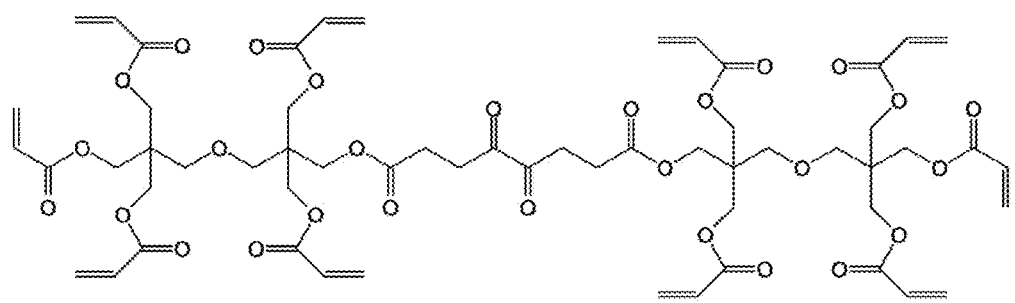
FIG. 4 illustrates a representative exemplary structure of biacetyl covalently bonded to two multiacrylic monomers.

In another preferred embodiment, both of the R groups on the initiator are also polyfunctional reactive monomers. For instance, $R_1$ and $R_2$ may be dipentaerythritol pentaacrylate groups, as shown in FIG. 4. Attaching two monomers to the functional initiator unit further inhibits diffusion and prevents initiators from interacting with one another.

Figure 5:
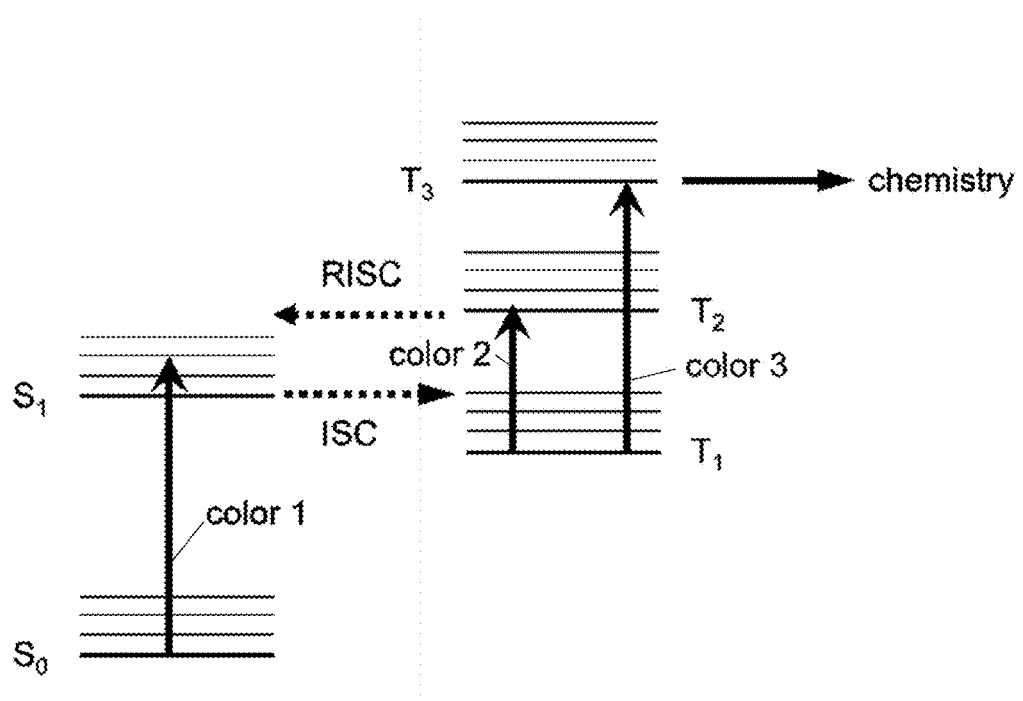
FIG. 5 illustrates a scheme for three-color photolithography using the disclosed class of molecules. The initiator is excited to $S_1$ with color 1, then undergoes intersystem crossing (ISC) to the lowest triplet state, $T_1$. $T_1$ is a metastable and unreactive "pre-activated" state. The initiator is then deactivated by color 2, which causes absorption to a higher triplet state ($T_2$) that undergoes reverse intersystem crossing (RISC) to a highly vibrationally excited level of $S_0$. Molecules that have not been deactivated can be excited with color 3 to a reactive triplet state $T_3$ (the "activated" state) to initiate polymerization.
Figure 6:
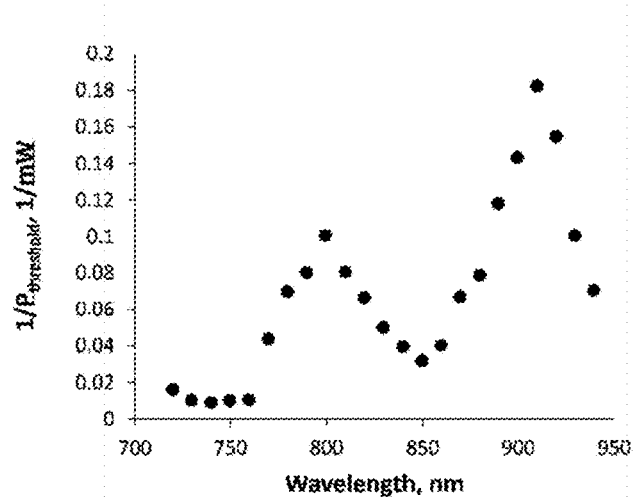
FIG. 6, Plate A, illustrates deactivation action spectrum from 720 nm to 940 nm for 1 wt % biacetyl in dipentaerythritol pentaacrylate excited by 2-photon absorption at 800 nm. Plate B illustrates transient absorption spectrum for biacetyl in carbon tetrachloride (e.g., see Singh et al. (1969), J. Phys. Chem. 73:2633-2643). The close correspondence between the peak positions indicates that deactivation occurs through excitation from $T_1$ to $T_2$ followed by reverse intersystem crossing.
Figure 6:
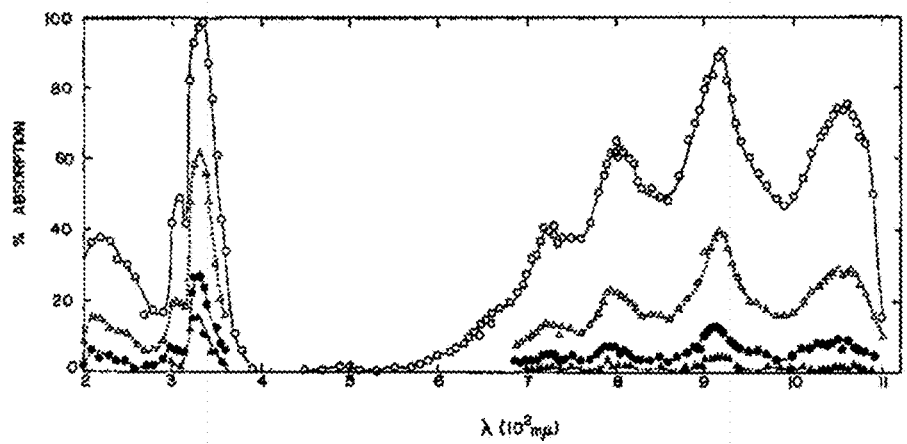

A potential mechanism for the disclosed three-color behavior is as follows. The first excitation takes the PI molecules to the first excited singlet state ($S_1$), which then undergo intersystem crossing (ISC) to the lowest triplet state ($T_1$, see FIG. 5). $T_1$ is a metastable state that does not lead directly to reactivity, and so is called an unreactive "pre-activated" state. A second color or wavelength of light takes pre-activated PI molecules to the next triplet state, $T_2$, which undergo RISC to a highly vibrationally excited level of the electronic ground state ($S_0$), thereby deactivating the PI molecules in selected locations. Pre-activated PI molecules that have not been deactivated may then be excited further via exposure to a third color or wavelength of light to take them to an activated state, which allows chemistry to occur. The three-color nature of this process effectively circumvents the background buildup problem inherent in conventional two-color materials, and thus achieves substantially higher resolution. As shown in FIG. 6, the wavelength dependence of deactivation following two-photon excitation at 800 nm is in close agreement with the transient absorption spectrum of the $T_1$ state of biacetyl, indicating that deactivation occurs through RISC.

Expanded Range of Confirmed Initiators.

A broader range of vicinal diketones has been tested for the ability to initiate and inhibit polymerization of radical photoresists with different beams of light (and/or with radiation having differing characteristics). In addition to biacetyl ($C_4H_6O_2$), specific molecules that have been tested and proven to exhibit this behavior include: benzil ($C_6H_5CO_2$), 2.2'-pyridil ($C_{12}H_8N_2O_2$), α-naphthil ($C_{22}H_{14}O_2$), β-naphthil ($C_{22}H_{14}O_2$), and furil ($C_{10}H_6O_4$).

Note that species in which the diketone is part of a closed ring system, such as camphorquinone, did not display this behavior.

Further Evidence for the Mechanism of Initiation and Implications for Photoresists.

As a further test of the mechanism of initiation, detailed transient absorption studies were performed on biacetyl in benzene. Excitation of biacetyl using radiation having a wavelength of about 355 nm was followed by intersystem crossing and relaxation to the lowest triplet state, giving a transient absorption spectrum akin to that shown in FIG. 6. The disappearance of the transient absorption arises from either relaxation of molecules (which is expected to be unimolecular, and therefore exponential), unimolecular reaction (which again should be exponential), or triplet-triplet annihilation (which should not be exponential). The major component of the decay kinetics is biexponential, indicating that triplet-triplet annihilation is the predominant mechanism of reactivity in solution.

Figure 7:
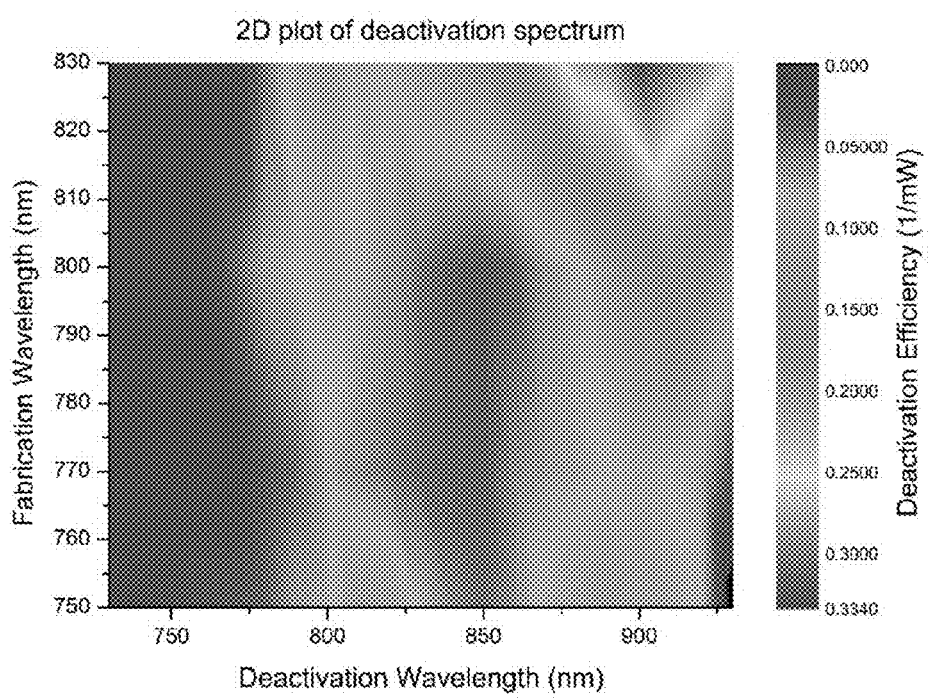
FIG. 7 illustrates three-dimensional, deactivation action spectrum showing that deactivation tracks the triplet absorption spectrum regardless of excitation wavelength.

Referring to FIG. 7, a detailed study of the deactivation action spectrum as a function of excitation wavelength was conducted. As shown, there is a clear dependence on the excitation wavelength, but the deactivation spectrum resembles the triplet absorption spectrum. These data provide further evidence that deactivation occurs through reverse intersystem crossing following absorption out of the triplet state.

Taken together, these data indicate that there are two paths to initiation of polymerization with these materials. The first path is the one outlined above, in which absorption from $T_1$ to a sufficiently energetic triplet state leads to initiation via the generation of radicals. In the second path, triplet-triplet annihilation causes a molecule to become sufficiently excited to cause initiation via the generation of radicals. The bimolecular path is undesirable given it is uncontrolled in that it does not require an activation beam. However, in accordance with disclosed embodiments, photoresists containing diketone initiators minimize this effect by: (1) using sterically bulky diketones that are less likely to undergo triplet-triplet annihilation; (2) inhibiting diffusion of the diketones through steric bulk and/or attachment to monomers; (3) incorporation of unreactive triplet quenchers; or (4) and combination of (1), (2) and/or (3).

Demonstration of Resolution Enhancement.

Figure 8:
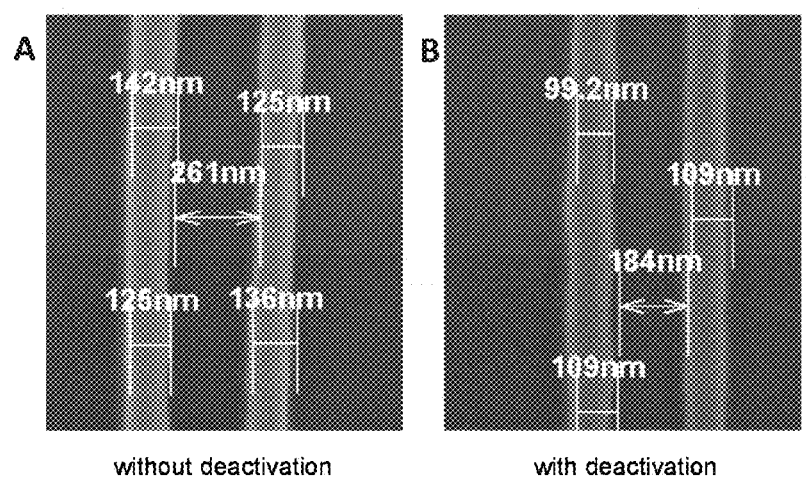
FIG. 8 illustrates resolution enhancement of line pairs in a 3-color photoresist with 1 wt % biacetyl as the photoinitiator in dipentaerythritol pentaacrylate with the implementation of deactivation in accordance with the present invention. Plate A shows the line pair without deactivation; Plate B shows the line pair with deactivation.

The ultimate goal of enhancing resolution has been demonstrated by 3-color or wavelength materials and schemes disclosed herein. For example, such resolution enhancement was demonstrated using 1 wt % biacetyl as the photoinitiator in dipentaerythritol pentaacrylate. As shown in FIG. 8, Plate B, substantial resolution improvement was achieved when pre-activation and activation were accomplished with pulsed light at 800 nm and deactivation was accomplished with continuous-wave light at the same wavelength.

Figure 9:
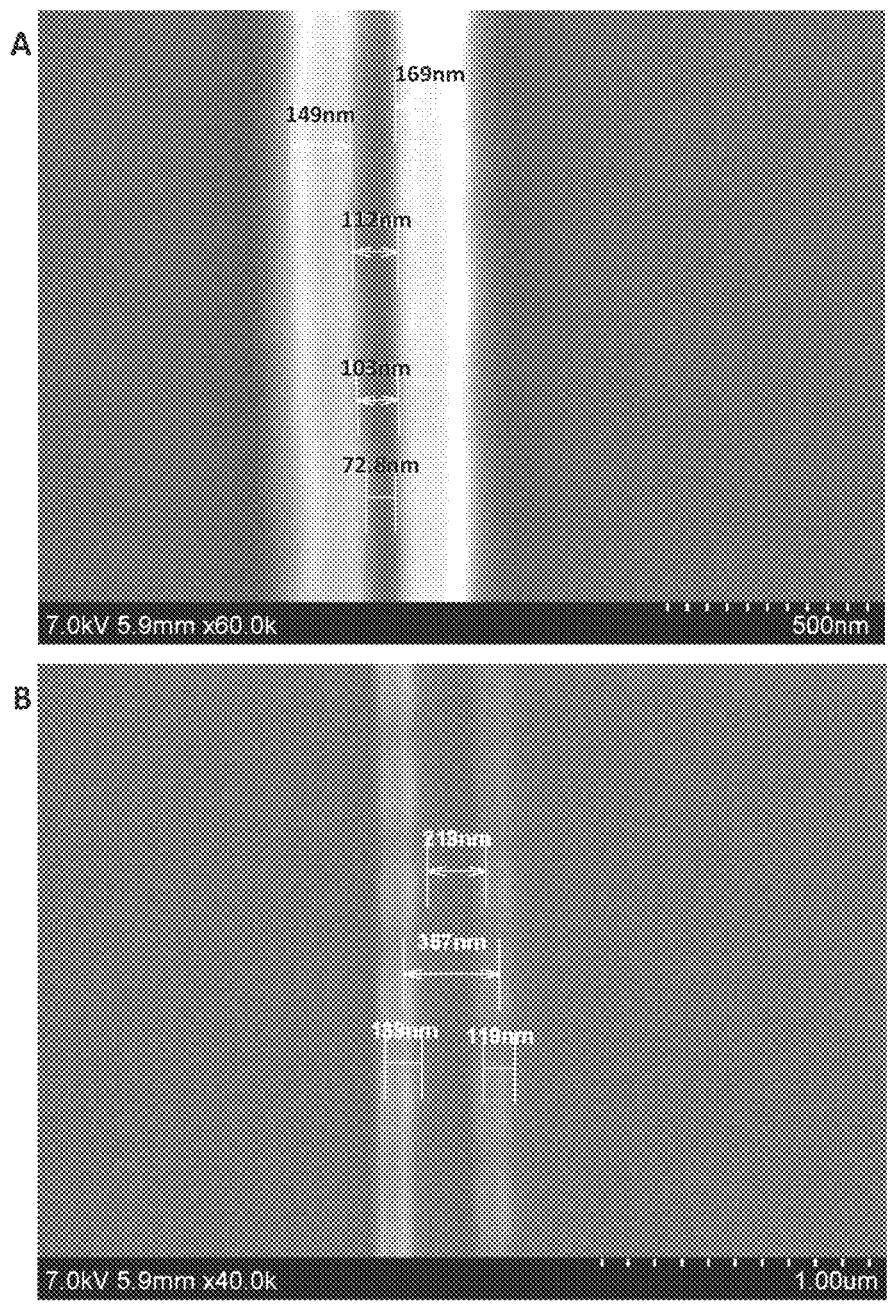
FIG. 9 illustrates resolution enhancement of line pairs in a 3-color photoresist with 0.5 wt % benzil as the photoinitiator in 1:1 SR368/499 (tris(2-hydroxy ethyl) isocyanurate triacrylate/ethoxylated(6) trimethylolpropane triacrylate) with the implementation of deactivation in accordance with the present invention. Plate A shows the line pair without deactivation; Plate B shows the line pair with deactivation.

Resolution enhancement was also demonstrated using 0.5 wt % benzil as the photoinitiator in 1:1 SR368/499 (tris(2-hydroxy ethyl) isocyanurate triacrylate/ethoxylated(6) trimethylolpropane triacrylate), with deactivation at different pitch (at maximum deactivation power of 100 mW after radial polarization). As shown in FIG. 9, Plate B, substantial resolution improvement was achieved when pre-activation and activation were accomplished with pulsed light at 800 nm and deactivation was accomplished with continuous-wave light also at 800 nm.

Figure 10:
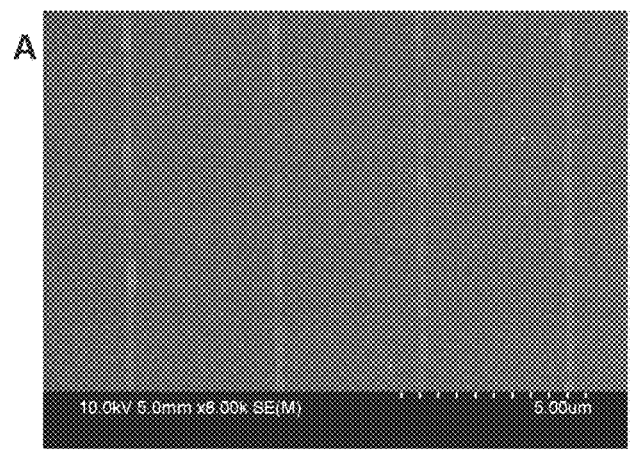
FIG. 10, Plate A, is an SEM image of unpatterned, chopped deactivation of a photoresist (4 pitch lines; linewidth from about 150 nm to about 300 nm) containing benzil as the initiator. Plates B and C are SEM images showing resolution enhancement by patterned deactivation of a photoresist containing benzil as the initiator.
Figure 10:
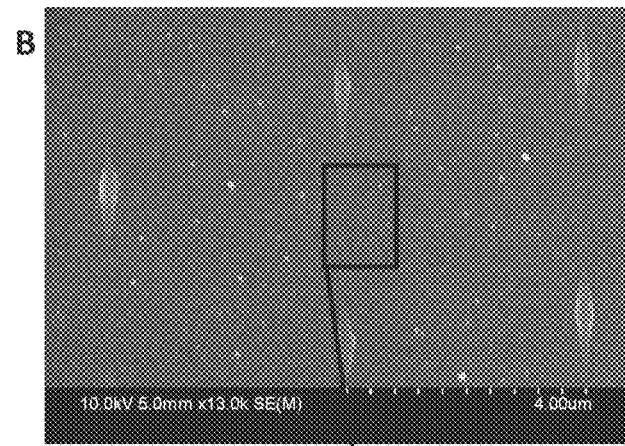
Figure 10:
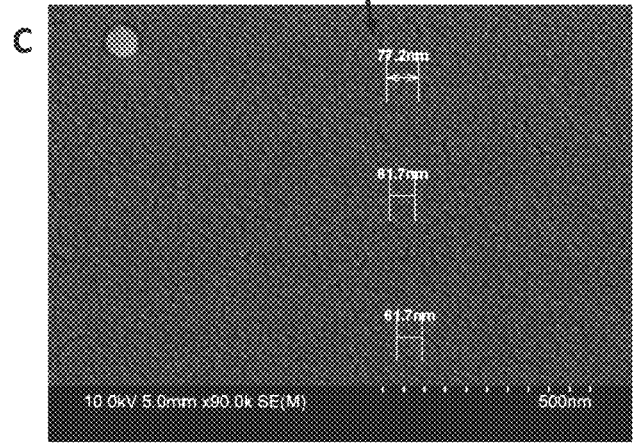

As shown in FIG. 10, Plate A, the presence of the deactivation beam inhibits radical polymerization in a photoresist composed of 0.5 wt % of benzil in 1:1 tris(2-hydroxy ethyl) isocyanurate triacrylate/ethoxylated(6) trimethylolpropane triacrylate. PI molecules that have not been deactivated (using continuous-wave laser (800 nm; 200 nW)) are then excited to an activated state (e.g. using two-photon absorption from a pulsed laser (800 nm; ML power 12.2 mW)). Further, when the deactivation beam passes through an appropriate phase mask before being focused, it provides a substantial improvement in resolution, as shown in FIG. 10, Plates B and C.

All identified publications and references are herein incorporated by reference to the same extent as if each individual publication was specifically and individually indicated to be incorporated by reference in its entirety. While the invention has been described in connection with exemplary embodiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the features hereinbefore set forth.

What is claimed is:

1. A multicolor photolithography method, comprising the steps of:
   providing a substrate at least partially coated with a layer of a photoresist composition comprising a reactive monomer and photoinitiator (PI) molecules;
   exposing said PI molecules to a first radiation source, thereby exciting said PI molecules from a ground state to a pre-activated state;

exposing said pre-activated state PI molecules to a second radiation source in selected locations, thereby deactivating said pre-activated state PI molecules in said selected locations; and exposing any of said pre-activated state PI molecules remaining to a third radiation source, thereby exciting said remaining pre-activated state PI molecules to an activated state, and initiating polymerization of said reactive monomer in said photoresist composition.

2. The method of claim 1, wherein said first radiation source is a pulsed laser.

3. The method of claim 1, wherein said second radiation source is a continuous-wave laser.

4. The method of claim 1, wherein said third radiation source is a pulsed laser.

5. The method of claim 1, wherein at least one of said first, second or third radiation source emits visible light.

6. The method of claim 1, wherein said photoinitiator molecules are a diketone having substituent groups $R_1$ and $R_2$, wherein at least one of $R_1$ or $R_2$ is selected from the group consisting of an alkyl substituent, an aryl substituent, a substituted aryl substituent, a heterocyclic aryl substituent, a cycloalkene substituent, and a heterocyclic cycloalkene substituent.

7. The method of claim 1, wherein said photoinitiator molecules are selected from the group consisting of biacetyl ($C_4H_6O_2$), benzil ($C_6H_5CO_2$), 2.2'-pyridil ($C_{12}H_8N_2O_2$), α-naphthil ($C_{22}H_{14}O_2$), β-naphthil ($C_{22}H_{14}O_2$), and furil ($C_{10}H_6O_4$).

* * * * *